United States Patent
Kim et al.

(10) Patent No.: US 9,406,911 B2
(45) Date of Patent: Aug. 2, 2016

(54) METHOD OF MANUFACTURING SUBSTRATE FOR DISPLAY DEVICE, SUBSTRATE FOR DISPLAY DEVICE, AND DISPLAY DEVICE

(71) Applicant: Samsung Display Co., Ltd., Yongin, Gyeonggi-Do (KR)

(72) Inventors: Yong-Kwan Kim, Asan-si (KR); Yong-Hwan Park, Cheonan-si (KR); Jae Seob Lee, Seoul (KR); Jin Gyu Kang, Cheonan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 1 day.

(21) Appl. No.: 14/279,704

(22) Filed: May 16, 2014

(65) Prior Publication Data
US 2015/0076460 A1 Mar. 19, 2015

(30) Foreign Application Priority Data

Sep. 16, 2013 (KR) .................. 10-2013-0111333

(51) Int. Cl.
| | | |
|---|---|---|
| *H01L 51/40* | (2006.01) | |
| *H01L 21/4763* | (2006.01) | |
| *H01L 21/31* | (2006.01) | |
| *H01L 21/469* | (2006.01) | |
| *H01L 51/00* | (2006.01) | |
| *H01L 51/56* | (2006.01) | |
| *H01L 29/08* | (2006.01) | |
| *H01L 35/24* | (2006.01) | |
| *H01L 23/58* | (2006.01) | |
| *H01L 23/48* | (2006.01) | |
| *H01L 23/52* | (2006.01) | |
| *H01L 29/40* | (2006.01) | |

(52) U.S. Cl.
CPC ............ *H01L 51/56* (2013.01); *H01L 51/0096* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 2007/0252155 A1* | 11/2007 | Cok | ................................ 257/79 |
| 2011/0064947 A1* | 3/2011 | Aiba | ........................ C08J 7/045 428/354 |
| 2013/0137029 A1* | 5/2013 | Kadonome et al. | ............ 430/105 |
| 2013/0161592 A1* | 6/2013 | Lee et al. | ......................... 257/40 |

FOREIGN PATENT DOCUMENTS

| | | |
|---|---|---|
| JP | 2011150803 A | 8/2011 |
| KR | 1020020066508 A | 8/2002 |

* cited by examiner

*Primary Examiner* — Calvin Choi
(74) *Attorney, Agent, or Firm* — Cantor Colburn LLP

(57) ABSTRACT

A method of manufacturing a substrate for a display device includes forming a first organic layer on a base substrate; forming an inorganic layer on the first organic layer; and forming a second organic layer on the inorganic layer, where the second organic layer includes transition metal particles.

21 Claims, 4 Drawing Sheets

METHOD OF MANUFACTURING SUBSTRATE FOR DISPLAY DEVICE, SUBSTRATE FOR DISPLAY DEVICE, AND DISPLAY DEVICE

This application claims priority to Korean Patent Application No. 10-2013-0111333, filed on Sep. 16, 2013, and all the benefits accruing therefrom under 35 U.S.C. §119, the content of which in its entirety is herein incorporated by reference.

BACKGROUND

1. Field

A method of manufacturing a substrate for a display device, a substrate for a display device, and a display device are disclosed.

2. Description of the Related Art

A display device displays an image, and recently, organic light emitting diode displays have been the focus of attention as the display device.

Since an organic light emitting diode display possesses light emitting characteristics and does not require a separate light source, unlike a liquid crystal display ("LCD"), the thickness and the weight of display devices may be reduced. The organic light emitting diode display exhibits high quality characteristics such as low power consumption, high luminance and high response speed, and the like.

Generally, an organic light emitting diode display includes a substrate, an organic light emitting diode, and an encapsulating part in between the substrate and the organic light emitting diode. The encapsulating part generally has a multi-layered structure of an organic layer/inorganic layer/an organic layer. The encapsulating layer blocks the permeation of moisture into the lower substrate.

The organic layer is formed on the inorganic layer using a method of plasma-treating the surface of the inorganic layer, changing the roughness of the surface of the inorganic layer, and inserting an adhesive layer between the organic and inorganic layers with consideration given to the adherence between the organic/inorganic layers, coating stability, and the like.

However, these methods are relatively inefficient in terms of process time and equipment.

SUMMARY

Provided herein are a method of manufacturing a substrate for a display device in which adherence between an organic layer and an inorganic layer secured, a substrate for a display device manufactured using the same method, and a display device including the substrate.

According to one embodiment, a method of manufacturing a substrate for a display device includes forming a first organic layer on a substrate; forming an inorganic layer on the first organic layer; and forming a second organic layer on the inorganic layer, where the second organic layer includes transition metal particles.

The forming of the second organic layer includes mixing an organic resin solution with transition metal particles to prepare a coating liquid, coating the inorganic layer with the coating liquid, and curing the inorganic layer coated with the coating liquid.

The forming of the inorganic layer on the first organic layer includes depositing an inorganic material on the first organic layer.

The transition metal particles have an average particle diameter of about 10 nanometers (nm) to about 1 micrometer (μm).

The coating liquid is prepared by dispersing the transition metal particle in the organic resin solution.

In the prepared coating liquid, substantially all of the transition metal particles settle on the bottom of the coating liquid.

The second organic layer is formed using at least one of spin coating, slit coating, screen printing, inkjet and one drop filling ("ODF") methods. The transition metal particles are present in an amount of less than or equal to about 1 weight percent (wt %) based on the total amount of the organic layer.

The first organic layer includes polyimide ("PI").

The second organic layer includes PI.

The forming of the inorganic layer includes alternately depositing a silicon oxide layer and a titanium oxide layer.

According to another embodiment, a substrate for a display device includes a first organic layer positioned on a substrate; an inorganic layer positioned on the first organic layer; and a second organic layer positioned on the inorganic layer, where the second organic layer includes transition metal particles.

Substantially all of the transition metal particles are present on a bottom surface of the second organic layer.

The transition metal particles are substantially in contact with the first organic layer.

According to yet another embodiment, a display device including the substrate for a display device is provided.

The display device may also include an organic light emitting diode.

Adherence between the organic layer and the inorganic layer may be secured without disposing a separate adhesive layer therebetween.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
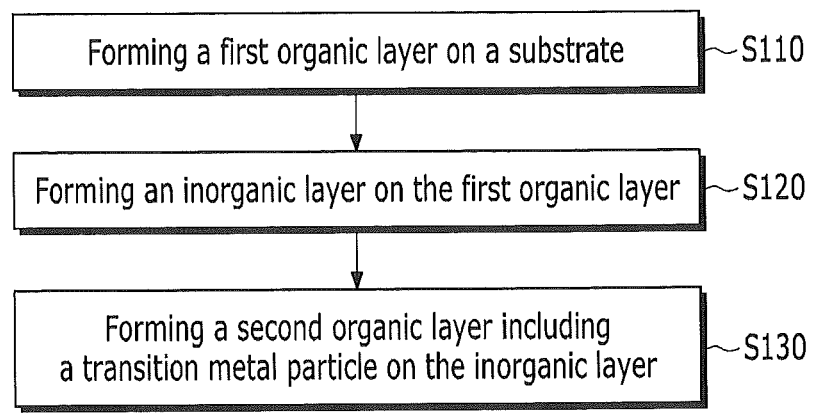
FIG. 1 is a flowchart showing an exemplary embodiment of a method of manufacturing a substrate for a display device.

The present disclosure will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, size and thickness of each component in the drawing are provided for better understanding and ease of description, and the present disclosure is not limited thereto.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a flowchart showing a method of manufacturing a substrate for a display device according to an exemplary embodiment.

Referring to FIG. 1, a method of manufacturing a substrate for a display device includes forming a first organic layer on a base substrate S110; forming an inorganic layer on the first organic layer S120; and forming a second organic layer including a transition metal particle, on the inorganic layer S130.

First, the forming a first organic layer on a base substrate S110 is described.

The base substrate may be any substrate usable in a panel such as a display panel of a display device, and may be, for example, an organic substrate or a polymer (plastic) substrate. The polymer substrate may be a polymer having high heat resistance. The polymer having high heat resistance may include one of polyimide, polyacrylate, polyethylene terephthalate, polyethylene naphthalate, polycarbonate, polyarylate, polyetherimide, polyethersulfone, tricellulose acetate, polyvinylidene chloride, polyvinylidene fluoride, an ethylene-vinylalcohol copolymer, and a combination thereof.

The first organic layer may include an organic resin.

The organic resin may include one or more of polyethyleneterephthalate, polyimide, polycarbonate, epoxy, polyethylene and polyacrylate.

The first organic layer may be formed as a single layer or a multilayer structure. The multilayer structure may include two or more layers having the same or different organic material in each layer.

The first organic layer may be formed by coating the base substrate with the organic resin prepared in the form of a solution. The first organic layer may be formed using at least one method comprising spin coating, slit coating, screen printing, inkjet and one drop filling ("ODF") methods, without limitation.

Subsequently an inorganic layer is formed on the organic layer after the first organic layer S120 has been formed.

The inorganic layer includes an inorganic material. The inorganic material may include at least one of silicon oxide, titanium oxide, and a combination thereof.

The forming of the inorganic layer may include alternately depositing a silicon oxide layer and a titanium oxide layer. The depositing may be performed using sputtering or chemical vapor deposition methods.

The inorganic layer may be formed as a single layer or a multilayer structure. The multilayer structure may be formed from two or more layers. In one embodiment, the inorganic layer includes three layers, for example a triple layer structure. The triple layer structure may include a structure having a silicon oxide layer/a titanium oxide layer/a silicon oxide layer or a structure having a titanium oxide layer/a silicon oxide layer/a titanium oxide layer.

After forming the inorganic layer, a second organic layer is formed on the inorganic layer S130. The second organic layer includes transition metal particles.

The transition metal may be any transition metal in the periodic table without limitation. In general, the metals Ag, Au and Cu having inactivity in the present invention are excluded. The transition metal is included in the second organic layer as a form of a particle.

The forming of the second organic layer may include mixing an organic resin solution with transition metal particles to prepare a coating liquid, coating the inorganic layer with the coating liquid, and curing the inorganic layer coated with the coating liquid.

First, the preparation of the coating liquid is described.

The coating liquid is prepared by mixing the organic resin solution and the transition metal particles.

The organic resin in the organic resin solution may include one or more of the organic resins described herein for use in the first organic layer.

The transition metal is dispersed in the organic resin solution in a form of particles. Accordingly, the transition metal particles settle to the bottom of the coating liquid.

The transition metal particle may be controlled to have, for example, an average particle diameter of about 10 nanometers (nm) to about 1 micrometer (μm) but is not limited thereof. When the average particle diameter is greater than or equal to about 10 nm, the transition metal particles may settle into a bottom portion of the second organic layer due to gravity thereby allowing the particles to make sufficient contact with the inorganic layer at the interface between the second organic layer and the inorganic layer. However, when the transition metal particles do not have a particle diameter within the above-described range, the particles contact the inorganic layer at the interface by controlling a dispersion process. When the particle diameter is less than or equal to about 1 μm, the influence of the transition metal particles on the roughness of a thin film may be minimized during the coating.

The transition metal particles may be included in the second organic layer in an amount of less than or equal to about 1 weight percent (wt %) based on the total amount of the second organic layer. When the transition metal particles are included within the above-described range, the second organic layer is capable of functioning as an organic layer and of securing adherence of the second organic layer to the inorganic layer.

After the coating liquid has been prepared, the coating liquid is coated on the inorganic layer.

The method of coating the coating liquid on the inorganic layer includes at least one of spin coating, slit coating, screen printing, inkjet and ODF methods, but is not limited thereto.

Subsequently, the layer coated with the coating liquid is cured. The curing time and temperature may be suitably selected by a person of ordinary skill in the art according to general application process conditions.

The second organic layer may be a single layer structure or a multilayer structure. The multilayer structure may include two or more layers and the organic resin in each layer may be the same or different.

The organic resin in the first organic layer and the second organic layer may be the same or different. In one embodiment, the organic resin included in the first organic layer may be a polyimide ("PI") and the organic material include in the second organic layer may be a polyimide PI.

In various embodiments, in the method of manufacturing a substrate for a display device, a separate adhesion layer disposed between the inorganic layer and the second organic layer may not be formed. In one embodiment, the substrate does not include an adhesion layer between the second organic layer and the inorganic layer.

As described above, the second organic layer includes transition metal particles, and the transition metal particles settle down (sink) to the bottom of the second organic layer due to gravitational pull. Accordingly, the transition metal particles contact the inorganic layer at the interface between the second organic layer and the inorganic layer and stably bond the second organic layer with the inorganic layer.

In general, transition metals are characterized as having free electron movement and thus, excellent reactivity, so that the transition metal may be easily changed into a cation when in a solution state. On the other hand, in general, an organic material has an unstable dangling bond. Accordingly, the transition metal may be chemically bonded with the organic material.

On the other hand, polyimide is in general a chemically stable and hydrophobic polymer. The polyimide has an imide bond, and charges may be gathered within the imide group (a CONH functional group). An empty D-orbital in the transition metal is easily coordinated with an unshared electron pair present within the polyimide.

Figure 2:
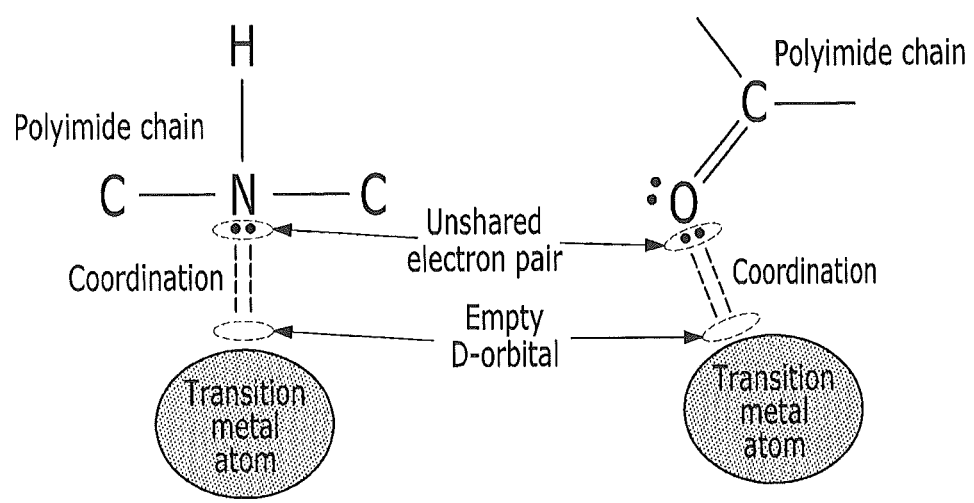
FIG. 2 is an illustration showing an exemplary effect of the present disclosure.

FIG. 2 is a schematic view showing a coordination bond formed between the shared electron pairs present in the imide group of the polyimide and the empty D-orbital of the transition metal. This coordination bond chemically stabilizes the interaction between the polyimide and the transition metal.

According to one embodiment, a method of manufacturing the substrate for a display device may secure adherence between the second organic layer and the inorganic layer occurs by using transition metal particles which sink down through the second organic layer to the interface of the second organic layer and the inorganic layer resulting in the formation of a thin film. The manufacturing process may therefore be simplified by including the transition metal particles in the organic layer rather than additionally forming a separate adhesive layer on the inorganic layer.

Figure 3:
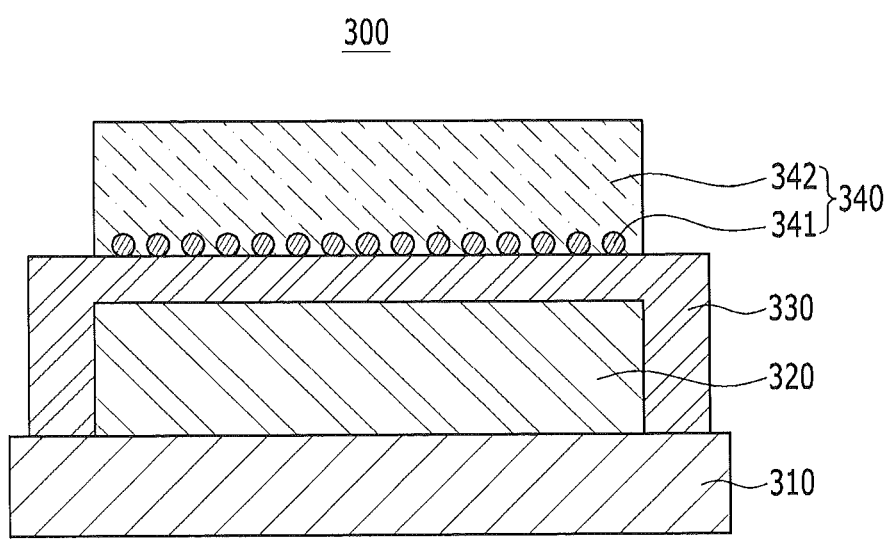
FIG. 3 is a cross-sectional view of an exemplary embodiment of a substrate for a display device.
Figure 4:
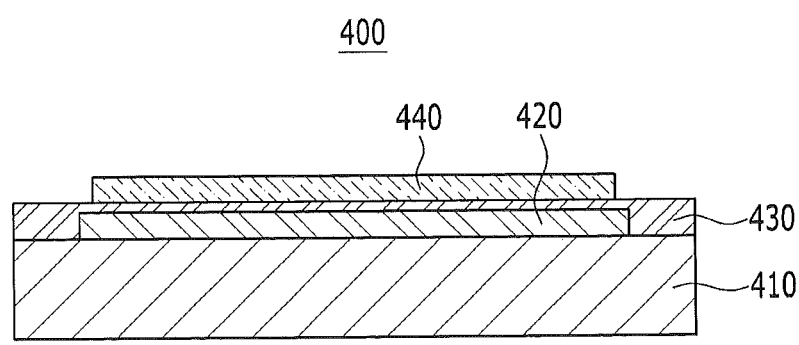
FIG. 4 is a cross-sectional view of a substrate for a display device prepared using a prior art method.
Figure 5:
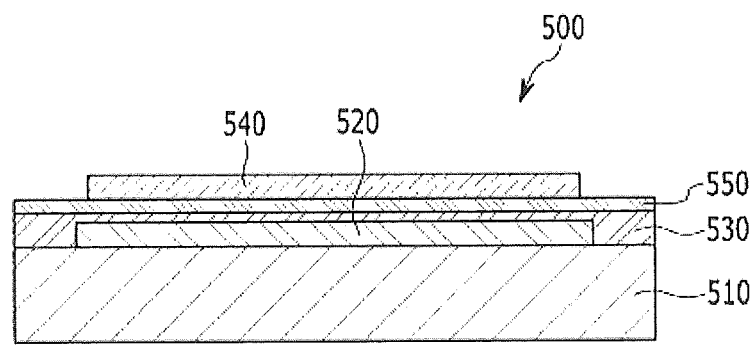
FIG. 5 is a cross-sectional view of a substrate for a display device prepared using a prior art method.

Exemplary substrates for a display device are illustrated in FIGS. 3 to 5.

FIG. 3 is a cross-sectional view of an exemplary substrate for a display device.

Referring to FIG. 3, a substrate 300 for a display device includes a base substrate 310, a first organic layer 320, an inorganic layer 330, and a second organic layer 340.

The second organic layer 340 includes transition metal particles 341 and an organic material (e.g., resin) 342.

The transition metal particles 341 may have a particle diameter of about 10 nm to about 1 μm, and may be included in an amount of less than or equal to about 1 wt % based on the total amount of the second organic layer 340.

When the transition metal particles 341 are dispersed in the organic material 342, the transition metal particles 341 have a predetermined weight and are subject to gravity. Accordingly, the transition metal particles 341 may be located at the bottom of the second organic layer 340. Specifically, substantially all of the transition metal particles 341 may be positioned in contact with the inorganic layer 330.

Herein, the transition metal particles 341 in the second organic layer 340 are in direct contact with the inorganic layer 330 and as a result the transition metal particles 341 and the inorganic material in the inorganic layer 330 form a stable chemical bond.

Accordingly, even though a separate adhesive layer between the inorganic layer and the second organic layer is omitted in the substrate for a display device, stable interlayer adherence may be ensured. As a result, the interlayer adherence may effectively prevent permeation of moisture into a display panel using the substrate.

The inorganic layer 330 may include a silicon oxide layer and a titanium oxide layer that are alternately deposited on the first organic layer, but is not limited thereto. The first organic layer 320 and second organic layer 340 may include polyimide as an organic material, but the organic material is not limited thereto.

FIGS. 4 and 5 are respectively cross-sectional views of substrates for a display device according to the prior art. For convenience, not all elements of the display device are illustrated in FIG. 4.

As shown in FIG. 4, a substrate for a display device 400 includes a base substrate 410, a first organic layer 420, an inorganic layer 430 and a second organic layer 440. Herein, the inorganic layer 430 and the second organic layer 440 respectively have different properties and thus, there is insufficient adherence between the inorganic layer 430 and the second organic layer 440. Due to the poor adherence between the two layers, moisture may readily permeate into the base substrate 410.

As shown in FIG. 5, a substrate for a display device 500 includes a base substrate 510, a first organic layer 520, an inorganic layer 530, and a second organic layer 540. A separate adhesive layer 550 is disposed between the inorganic layer 530 and the second organic layer 540. The adhesive layer 550 is formed using a separate process and thus has a disadvantage in terms of equipment, time, and the like.

Meanwhile, the exemplary substrate for the display device 300 in FIG. 3, which does not include an additional separate adhesive layer, is capable of achieving good adherence between the second organic layer and the inorganic layer, since the transition metal particles 341 form a thin film playing a role of an adhesive layer and react with the inorganic layer 330. In addition, the display device may be manufactured through a more efficient process.

Figure 6:
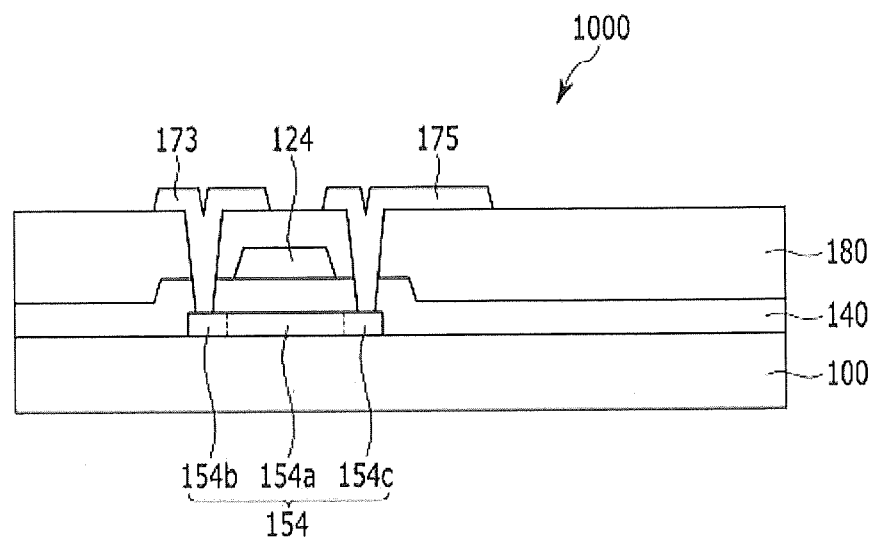
FIG. 6 is a cross-sectional view of an exemplary embodiment of a display device.

Hereinafter, an exemplary display device is described with reference to FIG. 6.

The substrate 100 of display device 1000 according to one embodiment includes any one of the above substrates for a display device.

On the substrate 100, a semiconductor layer 154 is formed. The semiconductor layer 154 includes a non-doped channel area 154a, a source area 154b doped with impurities, and a drain area 154c. The semiconductor layer 154 may include one of amorphous silicon, polysilicon, an organic semiconductor, an oxide semiconductor, and a combination thereof.

A gate insulating layer 140 is formed on the semiconductor layer 154 and on the substrate 100. The gate insulating layer 140 is formed on the entire surface of the substrate 100 that is not covered by the semiconductor layer 154. The gate insulating layer may include at least one of an inorganic material such as silicon oxide or silicon nitride, and an organic material such as polyvinyl alcohol. Contact holes are defined in the gate insulating layer 140 and extend through the thickness of the gate insulating layer 140 to expose the source area 154b and the drain area 154c.

The gate electrode 124 is formed on the gate insulating layer 140. The gate electrode 124 is overlapped with the channel area 154a on the semiconductor layer 154.

A passivation film 180 is formed on the gate electrode 124 and on portions of the gate insulating layer 140 which are not covered by the gate electrode 124. Contact holes are defined in the passivation film 180 and extend through the thickness of the passivation film to reveal the source area 154b and the drain area 154c.

A source electrode 173 and a drain electrode 175 are formed on the passivation film 180. The source electrode 173 is electrically and physically connected to the source area 154b of the semiconductor layer 154 through contact holes in the passivation film 180 and the gate insulating layer 140. The drain electrode 175 is electrically and physically connected to the drain area 154c of the semiconductor layer 154 through contact holes in the passivation film 180 and the gate insulating layer 140.

The semiconductor layer 154, the gate electrode 124, the source electrode 173, and the drain electrode 175 together form a thin film transistor ("TFT").

A pixel electrode (not shown) is formed on the thin film transistor and electrically connected thereto.

When the display device is an organic light emitting diode device, a common electrode (not shown) facing the pixel electrode may be present, and an emission layer (not shown), may be further disposed between the pixel electrode and the common electrode.

At least one of the pixel electrode and the common electrode may be a transparent electrode. When the pixel electrode is the transparent electrode, the device may have a bottom emission of emitting light toward the substrate 100. When the common electrode is the transparent electrode, the device may have a top emission of emitting light toward the opposite side of the substrate 100. In addition, when both the pixel electrode and the common electrode are transparent electrodes, light may be simultaneously emitted toward the substrate 100 and toward the opposite side of the substrate 100.

When the display device is a liquid crystal display ("LCD") device, a second substrate (not shown) facing the substrate 100 may be further included, and the facing second substrate may include at least one of a common electrode, a color filter, and the like on another base substrate. A liquid crystal is disposed between the substrate 100 and the facing second substrate.

Hereinafter, the present disclosure is illustrated in more detail with reference to examples. However, these examples are exemplary, and the present disclosure is not limited thereto.

EXAMPLES

Manufacture of Substrate for Display Device

Example 1

A polyimide solution was slit-coated on a glass base substrate and cured to form a first organic layer. Subsequently, alternating layers of $SiO_2$ and $SiTi_2$ were deposited on the first organic layer using a plasma-enhanced chemical vapor deposition ("PECVD") method and cured to form an inorganic layer having the structure $SiO_2/SiTi_2/SiO_2$.

A coating solution was prepared by adding titanium particles having a particle diameter of 0.2 μm to a polyimide solution and dispersing the titanium particles in the solution. The titanium particles were added in an amount of 0.2 wt % based on the total weight of the coating solution. Subsequently, the coating liquid was slit coated on the inorganic layer and cured to form a second organic layer on the inorganic layer, thereby manufacturing a substrate for a display device.

Comparative Example 1

A substrate for a display device was manufactured according to the same method as Example 1 except that no titanium particles were added to the coating solution.

Comparative Example 2

A substrate for a display device was manufactured according to the same method as Example 1 except that no titanium particles were added to the coating solution, and a separate titanium layer was formed on the inorganic layer using a PECVD method.

Evaluation

A low-temperature poly-silicon ("LTPS") process was used to form a normal backbone on the substrates for a display device described in Example 1 and Comparative Examples 1 and 2, and a peeling test was performed.

The results of the peel test showed that when an external impact was applied to the substrate of Example 1 and Comparative Example 2, the second organic layer was not peeled off from the inorganic layer and furthermore, the second organic layers could only be torn off, rather than peeled off with forced delamination.

On the other hand, when only a small amount of impact was applied to the substrate of Comparative Example 1, the second organic layer easily peeled off from the inorganic layer, and moisture was able to permeate into the peeled part and contract a panel.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A method of manufacturing a substrate for a display device, comprising:
    forming a first organic layer directly on a base substrate;
    forming an inorganic layer on the first organic layer; and
    forming a second organic layer on the inorganic layer,
    wherein the second organic layer comprises transition metal particles; wherein the transition metal particles and an inorganic material in the inorganic layer form a chemical bond.

2. The method of claim 1, wherein the forming of the second organic layer comprises mixing an organic resin solution with the transition metal particles to prepare a coating liquid, coating the inorganic layer with the coating liquid, and curing the inorganic layer coated with the coating liquid.

3. The method of claim 1, wherein the forming the inorganic layer on the first organic layer comprises depositing an inorganic material on the first organic layer.

4. The method of claim 1, wherein the transition metal particles have an average particle diameter of about 10 nanometers to about 1 micrometer.

5. The method of claim 2, wherein the preparing the coating liquid comprises dispersing the transition metal particles in the organic resin solution.

6. The method of claim 2, wherein substantially all of the transition metal particles settle to a bottom of the coating liquid.

7. The method of claim 1, wherein the forming the second organic layer comprises at least one of spin coating, slit coating, screen printing, inkjet, and one drop filling methods.

8. The method of claim 1, wherein an amount of transition metal particles is less than or equal to about 1 wt % based on the total amount of the second organic layer.

9. The method of claim 1, wherein the first organic layer comprises a polyimide.

10. The method of claim 1, wherein the second organic layer comprises a polyimide.

11. The method of claim 1, wherein the forming the inorganic layer comprises alternately depositing a silicon oxide layer and a titanium oxide layer.

12. A substrate for a display device, comprising:
    a first organic layer positioned directly on a base substrate;
    an inorganic layer positioned on the first organic layer; and
    a second organic layer positioned on the inorganic layer,
    wherein the second organic layer comprises transition metal particles, and
    wherein the transition metal particles and an inorganic material in the inorganic layer form a chemical bond.

13. The substrate for a display device of claim 12, wherein the transition metal particles have an average particle diameter of about 10 nanometers to about 1 micrometer.

14. The substrate for a display device of claim 12, wherein substantially all of the transition metal particles are present on a bottom surface of the second organic layer.

15. The substrate for a display device of claim 14, wherein the transition metal particles are substantially in contact with the inorganic layer.

16. The substrate for a display device of claim 12, wherein an amount of transition metal particles is less than or equal to about 1 wt % based on the total amount of the second organic layer.

17. The substrate for a display device of claim 12, wherein the first organic layer comprises polyimide.

18. The substrate for a display device of claim 12, wherein the second organic layer comprises polyimide.

19. The substrate for a display device of claim 12, wherein the inorganic layer comprises alternating layers of a silicon oxide layer and a titanium oxide layer.

20. A display device comprising the substrate for a display device of claim 12.

21. The display device of claim 20, wherein the display device further comprises an organic light emitting diode.

* * * * *